(12) United States Patent
Ling et al.

(10) Patent No.: US 9,859,736 B2
(45) Date of Patent: Jan. 2, 2018

(54) BATTERY CONTROL METHOD BASED ON AGEING-ADAPTIVE OPERATION WINDOW

(71) Applicant: INDUSTRIAL TECHNOLOGY RESEARCH INSTITUTE, Hsinchu (TW)

(72) Inventors: Shou-Hung Ling, Hsinchu (TW); Shih-Hao Liang, New Taipei (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 233 days.

(21) Appl. No.: 14/932,050

(22) Filed: Nov. 4, 2015

(65) Prior Publication Data
US 2016/0134146 A1 May 12, 2016

(30) Foreign Application Priority Data
Nov. 7, 2014 (TW) .............................. 103138786 A

(51) Int. Cl.
| | |
|---|---|
| H02J 7/00 | (2006.01) |
| H01M 10/44 | (2006.01) |
| H01M 10/48 | (2006.01) |
| G01R 31/36 | (2006.01) |

(52) U.S. Cl.
CPC ........ *H02J 7/0063* (2013.01); *G01R 31/3651* (2013.01); *G01R 31/3662* (2013.01); *H01M 10/44* (2013.01); *H01M 10/48* (2013.01); *G01R 31/3679* (2013.01); *H02J 2007/0067* (2013.01)

(58) Field of Classification Search
USPC ........................................................ 320/132
See application file for complete search history.

(56) References Cited

U.S. PATENT DOCUMENTS

| | | | |
|---|---|---|---|
| 6,208,147 B1 | 3/2001 | Yoon et al. | |
| 6,674,287 B2 | 1/2004 | Jang et al. | |
| 6,778,913 B2 * | 8/2004 | Tinnemeyer ....... | G01R 31/3606 702/30 |

(Continued)

FOREIGN PATENT DOCUMENTS

| | | |
|---|---|---|
| CN | 102553838 A | 7/2012 |
| CN | 102998626 A | 3/2013 |

(Continued)

OTHER PUBLICATIONS

European Patent Office, Search Report with Written Opinion, Patent Application No. EP14195821, dated Mar. 22, 2016.

(Continued)

*Primary Examiner* — Samuel Berhanu
(74) *Attorney, Agent, or Firm* — Maschoff Brennan

(57) ABSTRACT

A battery control method based on ageing-adaptive operation window is provided, including: performing a multi-dimensional electrochemical impedance spectrum method to obtain a three-dimensional Nyquist-vs-SoC relation diagram; using an equivalent circuit model to analyze the Nyquist-vs-SoC diagram to obtain at least a major ageing factor; defining an operation window stress index, and based on the stress index defining a plurality of control reference points for the battery operation window; and based on the plurality of control points, performing the control of battery discharging.

9 Claims, 9 Drawing Sheets

(56) References Cited

U.S. PATENT DOCUMENTS

| | | | |
|---|---|---|---|
| 6,832,171 B2 | 12/2004 | Barsoukov et al. | |
| 7,839,121 B2 | 11/2010 | Kim | |
| 8,519,674 B2 | 8/2013 | Anderson et al. | |
| 2007/0090843 A1* | 4/2007 | De Doncker | G01R 31/3662 324/426 |
| 2012/0078552 A1* | 3/2012 | Mingant | G01R 31/3662 702/63 |
| 2012/0296512 A1 | 11/2012 | Lee et al. | |
| 2015/0030891 A1* | 1/2015 | Sholklapper | H01M 10/48 429/50 |

FOREIGN PATENT DOCUMENTS

| | | |
|---|---|---|
| TW | 440698 B | 6/2001 |
| TW | I287313 B | 9/2007 |
| WO | WO-2013126520 A1 | 8/2013 |

OTHER PUBLICATIONS

Itagaki M et al: "In situ electrochemical impedance spectroscopy to investigate negative electrode of lithium-ion rechargeable batteries", Journal of Power Sources, Elsevier SA, CH, vol. 135, No. 1-2, Sep. 3, 2004 (Sep. 3, 2004), pp. 255-261, XP004532939, ISSN: 0378-7753, D01: 10.1016/J. JPOWSOUR.2004.04.004 * pp. 256-261; figures 3, 7*.

Smith, K., Markel, T., and Pesaran, A.,"PHEV Battery Trade-off Study and Standby Thermal Control," 26th International Battery Seminar & Exhibit, Fort Lauderdale, FL, Mar. 2009.

Waag Wladislaw, Kabitz Stefan and Sauer Dirk Uwe, "Experimental investigation of the lithium-ion battery impedance characteristic at various conditions and aging states and its influence on the application," Applied Energy, 102, issue C, pp. 885-897, 2013.

Yancheng Zhang and Chao-Yang Wang, "Cycle-Life Characterization of Automotive Lithium-Ion Batteries with $LiNiO_2$ Cathode," J. Electrochemical Society, 156 (7): A527-A535, 2009.

Shengbo Eben Li, Baojin Wang, Huei Peng, and Xiaosong Hua, "An electrochemistry-based impedance model for lithium-ion batteries," Journal of Power Sources, vol. 258, pp. 9-18, 2014.

N. Ogihar, S. Kawauchi, C. Okuda, Y. Itou, Y. Takeuchi, and Y. Ukyo, "Theoretical and Experimental Analysis of Porous Electrodes for Lithium-Ion Batteries by Electrochemical Impedance Spectroscopy Using a Symmetric Cell," J. Electrochemical Society, 159 (7), A1034-A1039, 2012.

* cited by examiner

BATTERY CONTROL METHOD BASED ON AGEING-ADAPTIVE OPERATION WINDOW

CROSS-REFERENCE TO RELATED APPLICATION

The present application is based on, and claims priority from Taiwan Application Serial Number 103138786, filed on Nov. 7, 2014, the disclosure of which is hereby incorporated herewith by reference herein in its entirety.

TECHNICAL FIELD

The technical field generally relates to a battery control method based on ageing-adaptive operation (AOW) window.

BACKGROUND

The phenomenon that the battery discharging characteristics changes throughout the lifespan of a battery is often called battery ageing. The effect of battery ageing is often observed in the capacity decay and reduced efficiency. The known battery test techniques usually involve fully charging the battery followed by fully discharging to obtain the actual battery capacity. In general, the time required to test a battery ranges from 1 to 10 hours (1C to 0.1C, C stand for capacity), which causes much inconvenience for the user. Therefore, various researches are conducted by both academics and industry to improve the understanding of the battery condition in order to operate the battery within safety parametric boundaries to lengthen the battery lifespan and usage safety.

The common research techniques on battery ageing usually employ analysis tools to describe and define the problems encountered by the battery, followed by performing prediction on the battery characteristics and, finally, finding solutions to the battery ageing problems. Some of the descriptive tools include such as, remaining capacity (decay), impedance (1 kHz, DC-IR), equivalent circuit model (ECM), electrochemical impedance spectrum (EIS), and so on; and some of the prediction tools include such as, lifetime model, remaining usable life (RUL), and so on. Because the tools used in predicting the characteristics of ageing battery require a large amount of computation, such as, the lifetime model and RUL, efficiency becomes an important concern.

A disclosed technique uses state of charge (SoC) measurements, temperature and other parameters, as well as intelligent algorithm, to estimate the current ageing state of the battery. Another technique disclosed a method and system of estimating battery state and parameters (such as, impedance, voltage, current temperature, and so on) to estimate the state of charge and the state of health of the battery. Yet another technique disclosed a system and method for ensuring the state of health of the battery set, by charging the battery set to the fullest and then ensuring the open-circuit voltage of the battery set to ensure the state of health of the battery set.

In the aforementioned and current battery ageing studies, shortcomings exist in actual application tests. For example, the shortcoming of the current EIS technique may include: (1) long test time: a long duration to charge and discharge is required to measure the EIS in all states of charge of the battery; and (2) poor reproducibility: as the measurement requires reconnecting the measurement wires, the contact impedance will affect the accuracy of the measurements. Therefore, it is imperative to devise a technique to study battery ageing so that the battery can operate in a lower stress condition.

SUMMARY

An exemplary embodiment relates to a battery control method based on ageing-adaptive operation window. The battery control method may comprise: performing a multi-dimensional electrochemical impedance spectrum (MD-EIS) method to obtain a three-dimensional Nyquist-vs-SoC relation diagram; analyzing the three-dimensional Nyquist-vs-SoC relation diagram by using an equivalent circuit model (ECM), to obtain at least one major ageing factor; defining a stress index relation of a battery operation window, and defining, based on the stress index relation, a plurality of control reference points for the battery operation window; and performing a battery discharging control based on the plurality of control points.

DETAILED DESCRIPTION OF THE DISCLOSED EMBODIMENTS

Figure 1:
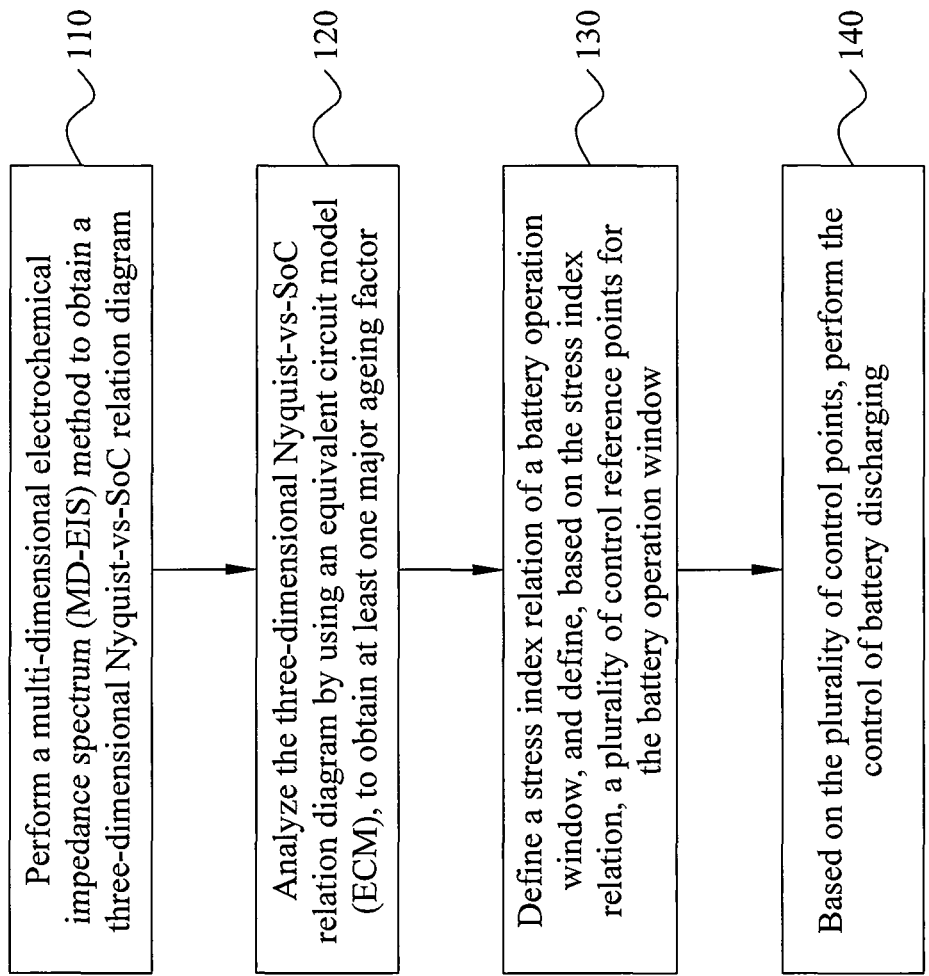
FIG. 1 shows a battery control method based on ageing-adaptive operation window, in accordance with an exemplary embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a battery control method based on ageing-adaptive operation window, in accordance with an exemplary embodiment of the disclosure. Referring to FIG. 1, the battery control method performs a multi-dimensional electrochemical impedance spectrum (MD-EIS) method to obtain a three-dimensional Nyquist-vs-SoC relation diagram (step 110); analyzes the three-dimensional relation diagram by using an equivalent circuit model (ECM), to obtain at least a major ageing factor (step 120); defines a stress index relation of a battery operation window, and defines, based on the stress index relation, a plurality of control reference points for the battery operation window (step 130); and based on the plurality of control points, performs a battery discharging control (step 140).

In step 110, performing the MD-EIS method is that fully charging a battery, and then during a discharging process, adding an EIS test carrier wave to a discharging current until the battery discharging to a lowest voltage to obtain the three-dimensional Nyquist-vs-SoC relation diagram. The test carrier wave may be within a settable range, such as, 100 kHz-1 mHz, or 10 kHz-10 mHz.

Figure 2:
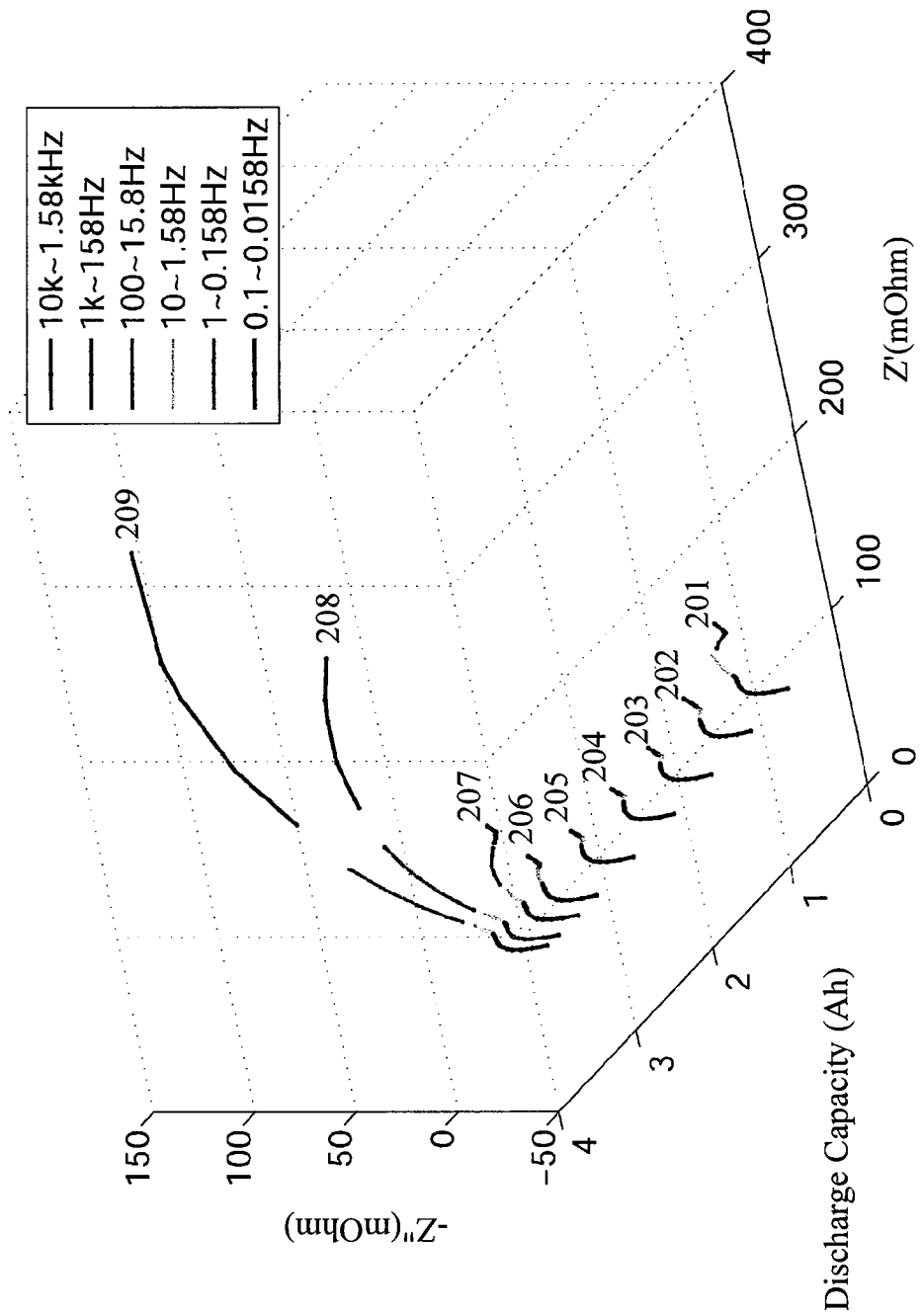
FIG. 2 shows a schematic view of a multi-dimensional electrochemical impedance spectrum test with the test carrier wave in a range of 100 kHz~1 mHz, in accordance with an exemplary embodiment of the disclosure.

FIG. 2 shows a schematic view of a multi-dimensional electrochemical impedance spectrum test with the test carrier wave in a range of 100 kHz~1 mHz, in accordance with an exemplary embodiment of the disclosure. Wherein, each of the curves 201~209 represents the result obtained by performing the EIS test during the discharging process after fully charging the battery. The first test result is shown as the curve 201, which is the Nyquist diagram in a fully charged state. The curve 201 includes the frequency response for the 10 KHz~0.0158 Hz, wherein Z' is the real-part impedance and Z" is the imaginary-part impedance. During the discharging process, the EIS test can be performed again at a specific discharge capacity to obtain curves 202~209, respectively. The changes of the curves with respect to the discharge capacity show the battery characteristics from the fully charged state to a lowest voltage state. The collection of the curves 201~209 are called as a MD-EIS diagram, i.e., the three-dimensional Nyquist-vs-SoC relation diagram.

Figure 3:
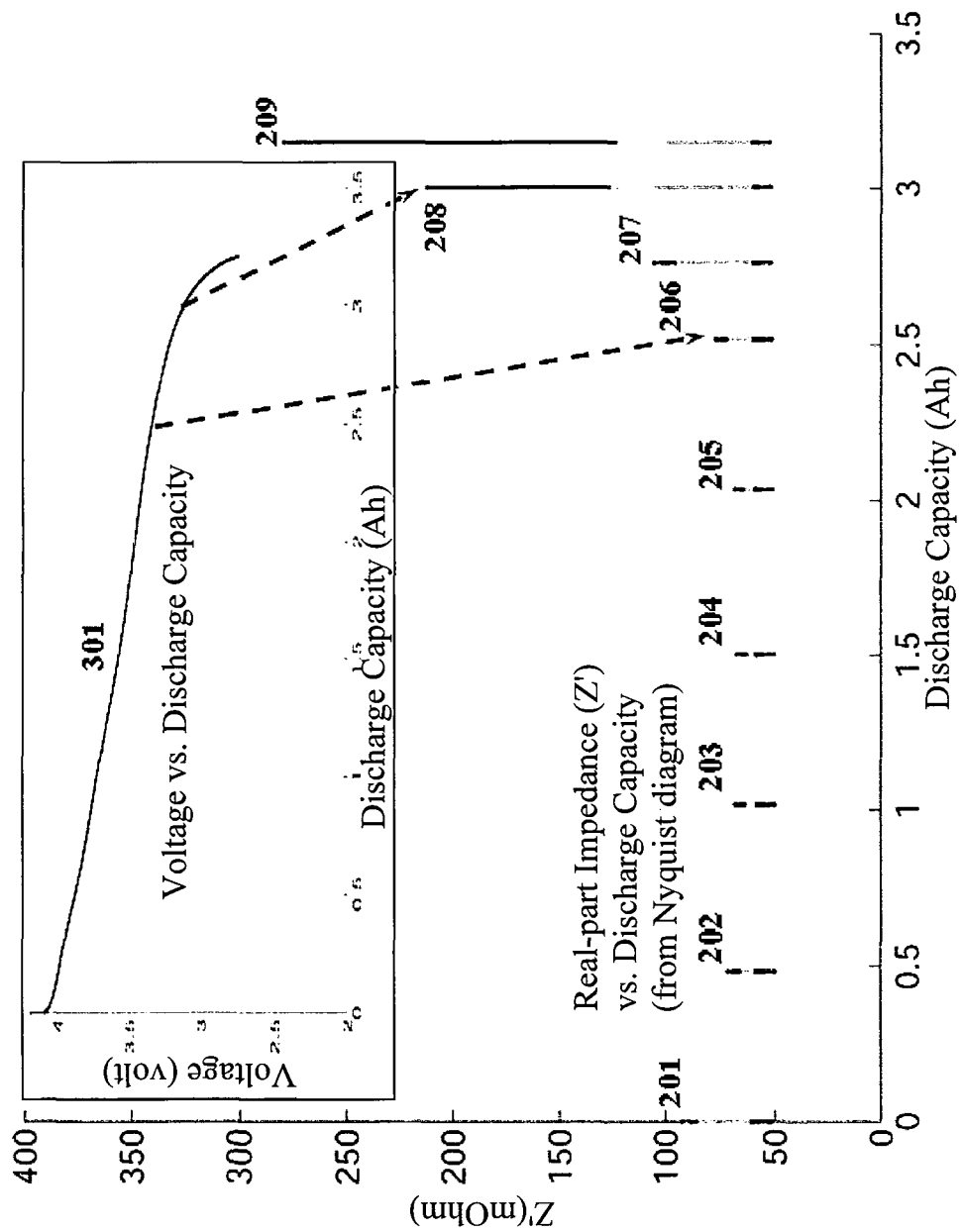
FIG. 3 shows a schematic view of the real-part impedance of a multi-dimensional electrochemical impedance spectrum and V-Ah characteristics, in accordance with an exemplary embodiment of the disclosure.

After obtaining the three-dimensional Nyquist-vs-SoC relation diagram, the method uses the real-part impedance of a multi-dimensional electrochemical impedance spectrum and V-Ah characteristics, as shown in FIG. 3, to obtain a relation between the voltage abrupt decrease at low battery SoC and the abrupt increase of the real-part impedance in the MD-EIS diagram. Also, as the battery approaching the fully charged state, the impedance increases. As shown, a curve 301 is the battery voltage vs. discharge capacity, and shows the voltage change as the battery discharging from a full battery state to a low capacity at a fixed current. The abrupt decrease appears roughly at the discharge capacity 3 Ah. However, as shown in transition from the Nyquist diagram in FIG. 2 to the real-part impedance vs. discharge capacity diagram, the curves 201-209 during the discharging process can be observed that the real-part impedance of the battery increases as the discharge capacity increases at the low frequency range (0.1 Hz-0.0158 Hz), and the abrupt increase appears roughly at the discharge capacity 2.5 Ah. Therefore, the MD-EIS test may detect the battery experiencing a large discharge stress at an earlier time than the voltage vs. discharge capacity curve 301.

Figure 4:
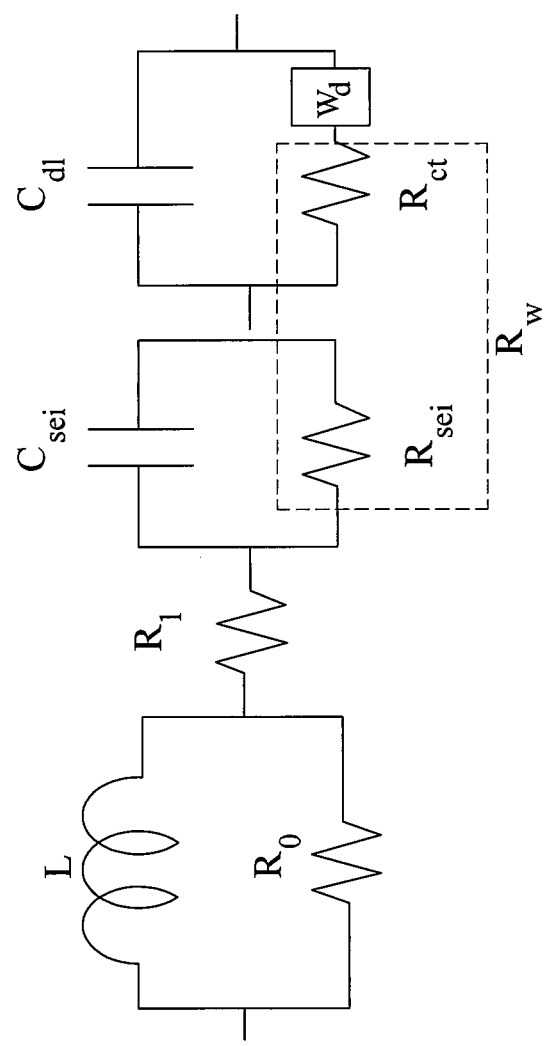
FIG. 4 shows a schematic view of an equivalent circuit model, in accordance with an exemplary embodiment of the disclosure.

Step 120 is to uses an ECM to analyze the three-dimensional Nyquist-vs-SoC relation diagram to obtain at least one major ageing factor, wherein the at least one major ageing factor further includes a stress factor coefficient. FIG. 4 shows a schematic view of an equivalent circuit model, in accordance with an exemplary embodiment of the disclosure; wherein L and $R_0$ represent the high frequency characteristics of the battery in EIS test, caused by the inductance effect of the metal parts in the battery. $R_1$ is an internal serial impedance of the battery, caused by the electrodes, electrolyte and connecting wires. $R_{sei}$ and $C_{sei}$ represent respectively the impedance and the parallel capacitance of the solid electrolyte interface (SEI) film formed on the surface of the internal electrodes of the battery. $R_{ct}$ is an impedance effect of the charge transfer, representing the resistance experienced by the lithium ion trespassing from the liquid electrolyte to the solid electrode interface. $C_{dl}$ represents the capacitance effect caused by the positive and negative electrodes in the battery. $W_d$ is a Warburg coefficient, representing the factor of the lithium ion diffusing within the electrode. A larger Warburg coefficient means a lower resistance in diffusion. According to one exemplary embodiment, the stress factor is defined by an impedance coefficient and a Warburg coefficient $W_d$, and the impedance coefficient includes a charge transfer impedance and an SEI film impedance.

Figure 5:
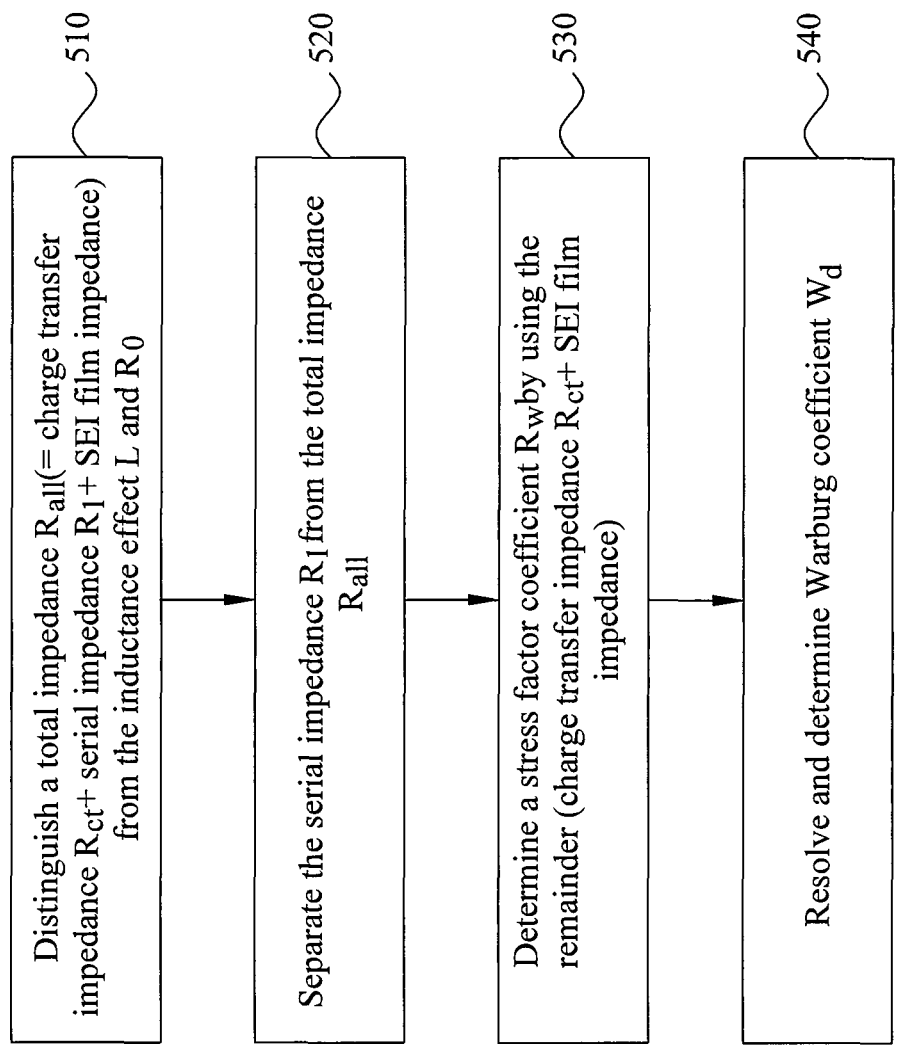
FIG. 5 shows an operation flow of a transformation of the equivalent circuit model of FIG. 4, in accordance with an exemplary embodiment of the disclosure.
Figure 6:
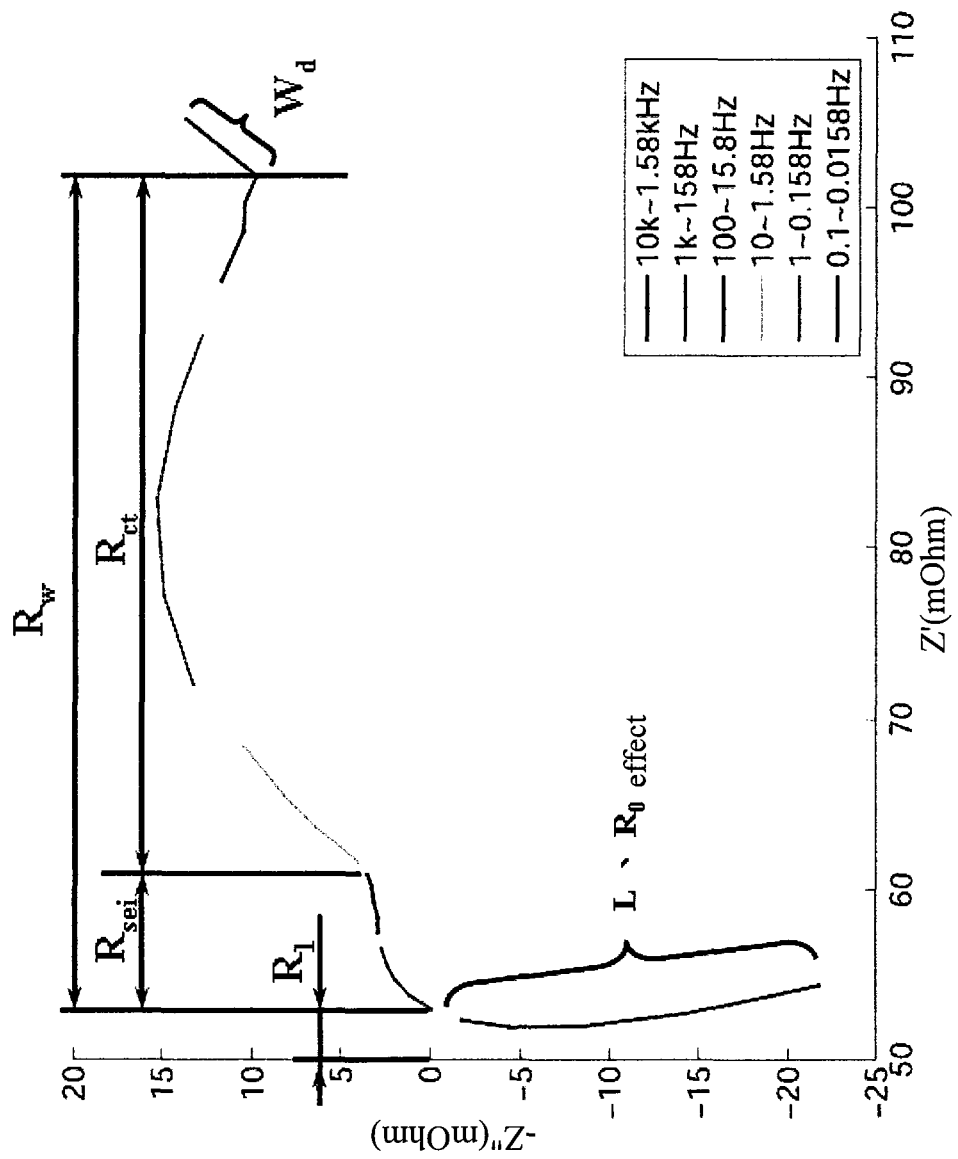
FIG. 6 shows a schematic view of using the equivalent circuit model and the steps in FIG. 5 to determine a Warburg coefficient $W_d$, in accordance with an exemplary embodiment of the disclosure.

FIG. 5 shows an operation flow of a transformation of the equivalent circuit model of FIG. 4, in accordance with an exemplary embodiment of the disclosure. Referring to FIG. 5, the operating flow of the ECM transformation may include: distinguishing a total impedance $R_{all}$ (=a charge transfer impedance $R_{ct}$+a serial impedance $R_1$+a SEI film impedance) from the inductance effect L and $R_0$ (step 510); separating the serial impedance $R_1$ from the total impedance $R_{all}$ (step 520); after separating the serial impedance $R_1$ from the total impedance $R_{all}$, using the remainder (charge transfer impedance $R_{ct}$+SEI film impedance) to determine a stress factor coefficient $R_w$ (step 530), wherein the $R_w$ represents the stress factor coefficient of the battery characteristics; and resolving and determining the Warburg coefficient $W_d$ (step 540). FIG. 6 shows a schematic view of using the equivalent circuit model and the steps in FIG. 5 to determine a Warburg coefficient $W_d$, in accordance with an exemplary embodiment of the disclosure. First, the total impedance $R_{all}$ may be determined as follows: the curve below zero along −Z" is considered as the effect of L and $R_0$; and an end Warburg effect at the frequency lower than 1 Hz is to find, which has the feature of consistent increase in the real-part and the imagery-part, thus there is a 45° slope in the Nyquist diagram; then, the impedance $R_1$ is separated (step 520), which is the horizon value of the intersection with the Z' axis in the Nyquist diagram; determining the stress factor coefficient $R_w$ by using $R_{ct}$+$R_{sei}$ (step 530), wherein $R_w$ has the value of the Z' value of the Warburg effect origin minus $R_1$ (as shown in FIG. 6); and finally, a numeric fitting method is used to determine the Warburg coefficient $W_d$ in the Nyquist diagram (step 540). It should be noted that the stress factor coefficient $R_w$ equals to $R_{ct}$+$R_{sei}$.

Figure 7:
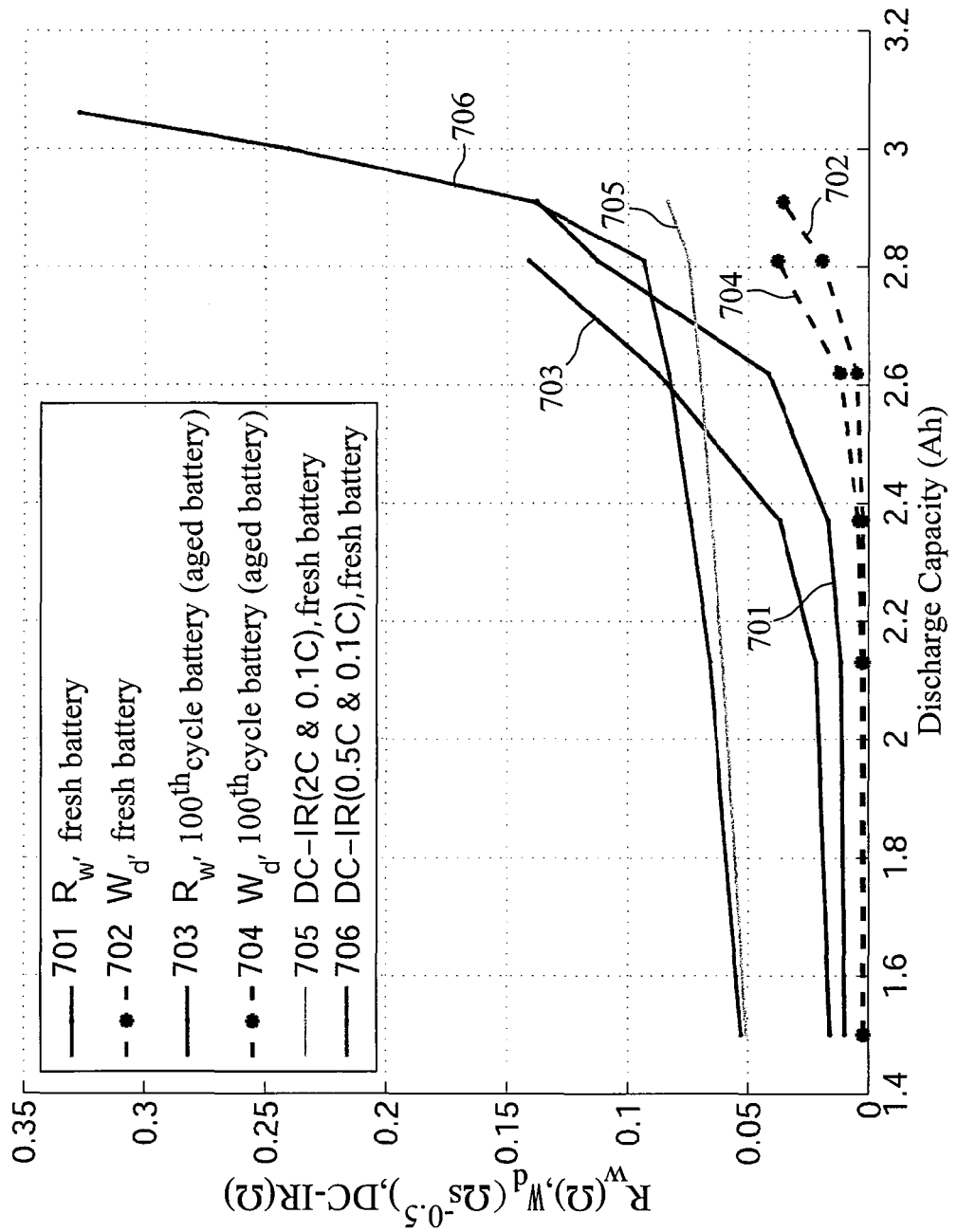
FIG. 7 shows a schematic view of the stress factor changing versus state of charge (SoC), in accordance with an exemplary embodiment of the disclosure.

FIG. 7 shows a schematic view of the stress factor changing versus state of charge (SoC), in accordance with an exemplary embodiment of the disclosure. As shown in FIG. 7, a curve 701 and a curve 702 represent respectively the changes in $R_d$ and $W_d$ as the discharge capacity increases of a fresh battery; while a curve 703 and a curve 704 represent respectively the changes in $R_d$ and $W_d$ as the discharge capacity increases after the fresh battery gone through 100 cycles of charge-and-discharge. In comparison, a curve 705 and a curve 706 represent the result by using a conventional DC-IR test. The abrupt change phenomenon appears in both FIG. 3 and FIG. 7. As shown, the $R_w$ and the $W_d$ parameters abruptly increase at 2.2 Ah in the MD-EIS while the abrupt increase phenomenon appears at 2.8 Ah in the DC-IR test. Thus, the MD-EIS and the ECM test may detect the battery operation stress earlier than the DC-IR test, and may prepare to control the battery accordingly to prolong the lifetime. In contrast, when the conventional DC-IR detects the abrupt increase, the battery is nearly exhausted, wherein the adjustment range and the effect are limited, and ageing caused by the stressed operation is irreversible.

Referring back to step 130 in FIG. 1, an stress index relation of an operation window is defined, and a plurality of control reference points for the battery operation window are defined based on the stress index relation. As the trends of the changes in the stress factor coefficient $R_w$ and the Warburg coefficient $W_d$ vs. SoC shown in FIG. 7, the trend may be used to define operation window parameters for the battery, which include the relation of the voltage and current of the battery and SoC. For example, by using the stress factor coefficient $R_w$ and the Warburg coefficient $W_d$ around the 50% SoC of the battery as a lowest stress index, the start point for controlling the operation window can be found by comparing the ratio of the stress indices of the full charge and the lowest capacity with the lowest stress index each other. For example, the control parameters may include a maximum current (charging, discharging) allowable point, a final voltage operation point (charging voltage, lowest discharging voltage), and the start and end points of the battery discharge window. A stress index of an operation window is a combination of the stress factor coefficient $R_w$ and Warburg coefficient $W_d$. For example, the stress index of an operation window may be expressed as follows:

$$\text{Stress index} = R_w \times (x) + W_d \times (1-x) \quad (1)$$

Wherein, x is a value between 0 and 1. A preferred application is to adjust the charging or discharging parameters as the battery ages. For example, if the lifetime of a battery is 3000 cycles of charging and discharging, the adjustment may be performed every 300-500 cycles. Alternatively, the lifetime of the battery is estimated as 10 years, and the adjustment may be performed every half year or a year.

In the following exemplary embodiments, the x in the relation (1) is set as 1, and the corresponding stress index equals to $R_w$. The following description explains the selection of a discharge control start point of an operation window for the battery, a stop point of the battery charging, and a stop point of battery discharging to achieve controlling the operation window as the battery ages so as to prolong the lifetime of the battery. In other words, in accordance with one exemplary embodiment, the plurality of control reference points may further include a control start point, a stop point of battery discharging and a stop point of battery charging.

Figure 8:
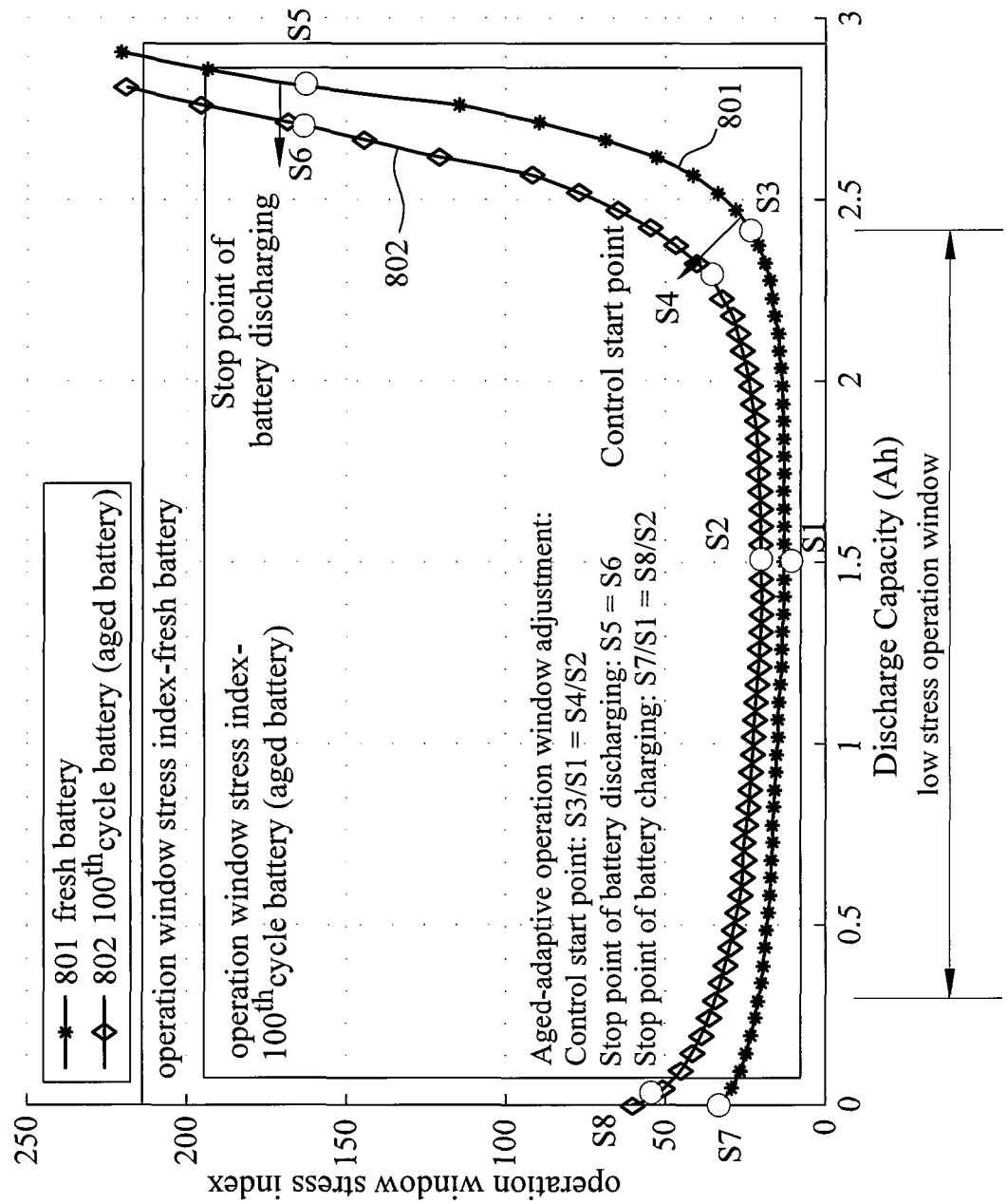
FIG. 8 shows a schematic view of defining an ageing-adaptive operation window for a battery, in accordance with an exemplary embodiment of the disclosure.

First, the discharging control point of the operation window is selected. FIG. 8 shows a schematic view of defining an ageing-adaptive operation window for a battery, in accordance with an exemplary embodiment of the disclosure. Wherein a curve 801 represents the stress index for a fresh battery, and a curve 802 represent the stress index for an aged battery. It may be seen from the definition scheme shown in FIG. 8, the stress factor coefficient $R_w$ of the fresh and aged (e.g., after $100^{th}$ cycles) changes with SoC, and reaches the minimum at around 50% SoC. Within this region, the lower stress indices for fresh and aged batteries are S1 and S2 respectively. When the battery capacity is low, the stress index will rise abruptly, so that a point, for example, with a value 5%-50% higher than 50% SoC, can be selected to start controlling. In the low capacity region, the fresh and aged batteries also have higher stress indices. In other words, a control start point may be selected as a point where the battery corresponding to a value 5%-50% higher than 50% SoC, and the adjustment control may start after the selection.

In FIG. 8, the corresponding stress indices for the fresh and aged batteries are S3 and S4, respectively. The ratio of S3/S1 is 23.8/12.8. Therefore, the control start point (S4) for the aged battery may be selected with the rule S4/S2=S3/S1. If the aged battery only starts to control until discharging to point S3, the stress index will increase to accelerate ageing process. In other words, the control start point for an aged battery is selected by following the S4/S2=S3/S1 rule, wherein S1 and S2 correspond respectively to the lower stress index for the fresh and aged batteries in the 50% SoC region, and S3 and S4 correspond respectively to the control start point for the fresh and aged batteries.

Then, the stop point of battery charging is selected. As shown in FIG. 8, the selection of a stop point of battery charging follows a rule similar to the selection of the control start point, i.e., S8/S2=S7/S1, wherein S7 and S8 are the points where the fresh and aged batteries charged to the charging voltage and the cutoff current specified by the manufacturer respectively. And, the stop point of battery discharging is selected. When the battery ages, as the $100^{th}$ cycle battery shown in the exemplar of FIG. 8, the stress index curve also shifts. The selection of the stop point of battery discharging is that the fresh battery and the aged battery should display the same stress index, i.e., S5 and S6, where the two points have the same stress index. In other words, S5 and S6 represent respectively the stop point of battery discharging for fresh and aged batteries, and show the same stress index.

Figure 9:
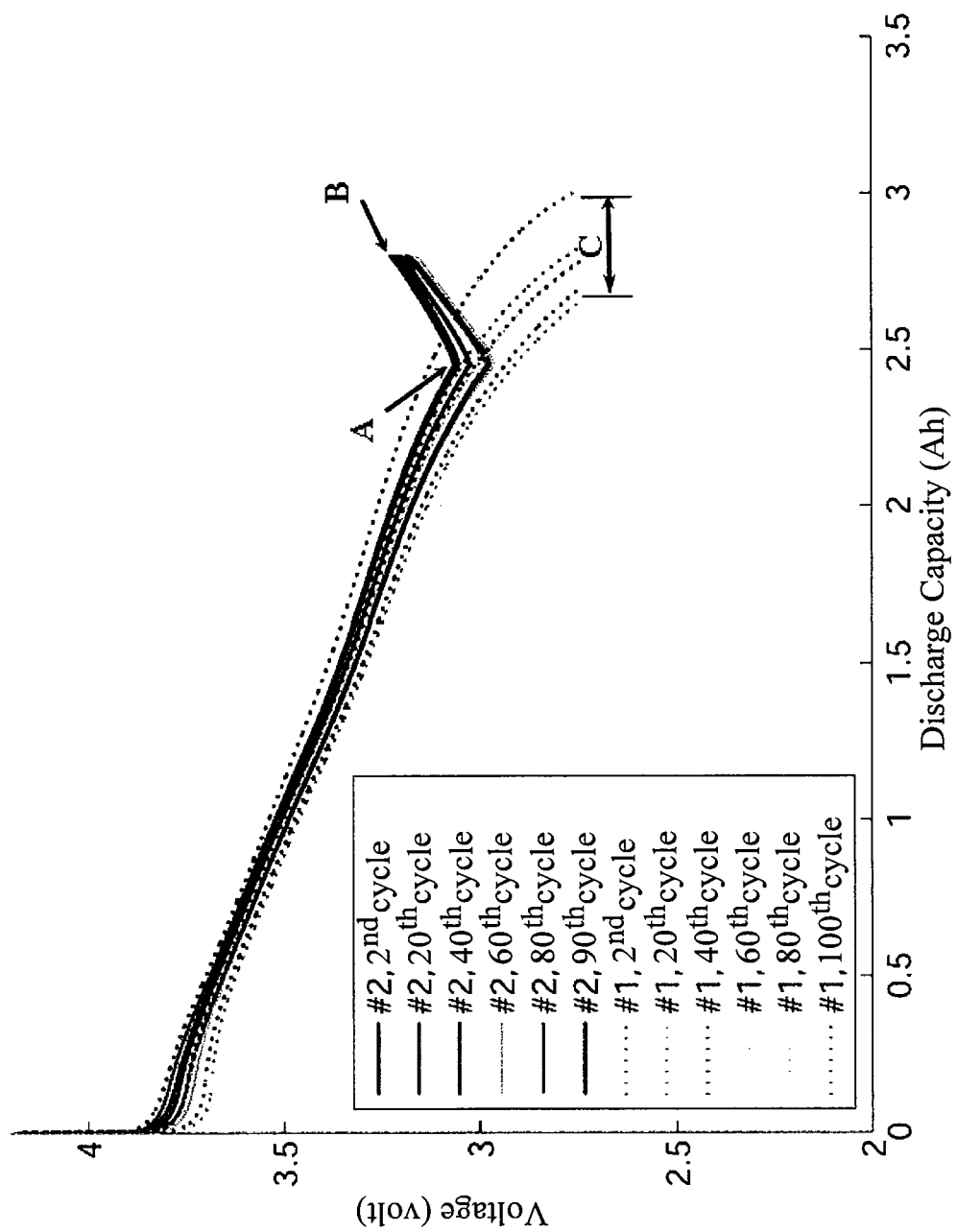
FIG. 9 shows a schematic view of the performance results of the battery control method, in accordance with an exemplary embodiment of the disclosure.

FIG. 9 shows a schematic view of the performance results of the battery control method, in accordance with an exemplary embodiment of the disclosure. Wherein, point A is a control start point of the operation window, with a discharging C-rate at the maximum recommended by the manufacturer. Point B is a stop point for battery discharging, with a discharging C-rate slightly lower than the maximum recommended by the manufacturer. The dash line represents a plurality of relation curves of the voltage vs. discharge capacity without the operation window control. Window C shows a larger dispersion than the result with operation window control, which means that the postponing of the ageing by controlling operation window is better than the discharging recommended by the manufacturer. As shown in FIG. 9, the maximum discharge current 2C (C stands for battery discharge C-rate) is adjusted to 0.1C (or smaller discharging value) at point B (2.8 Ah) when the discharge capacity is at 2.45 Ah (point A). With point A and point B, the current value between the two points can be defined. The present exemplary embodiment uses a linear equation to define the current value at each SoC. When aged, the battery may utilize the remaining capacity more efficiently when discharging, in comparison with the approach without the aged-adaptive control. In addition, the battery ages at a slower pace with the aged-adaptive control method. Another approach to further utilize the battery is to allow the battery to discharge at a current higher than recommended by the manufacture when the battery is in a region of a lower stress index. Because the battery operates under the higher stress index in the low capacity and full capacity, the battery can provide more cycles than operating at the parameters recommended by the manufacturer.

In summary, according to the exemplary embodiments of the present disclosure, a battery control method based on ageing-adaptive operation window is provided. the battery control method includes: performing a multi-dimensional electrochemical impedance spectrum method to obtain a three-dimensional Nyquist-vs-SoC relation diagram; analyzing the three-dimensional Nyquist-vs-SoC relation diagram by using an equivalent circuit model (ECM), to obtain at least one major ageing factor; defining a stress index relation of a battery operation window, and defining, based on the stress index relation, a plurality of control reference points for the battery operation window; and performing a battery discharging control based on the plurality of control points.

The battery control method based on the ageing-adaptive operation window does not rely on the experimental trial and error approach, but on the battery electrochemical impedance theory to save time and cost in defining the preferred operation window for the battery. The method is applicable in an offline and/or periodic manner to test the battery set, or embedded in a battery management system (BMS) to compute operation window parameters for a battery to prolong the lifetime of the battery. The method does not require additional hardware and is applicable to current mobile devices, electric car systems, smart grid battery reutilization selection techniques, and so on.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A battery control method based on ageing-adaptive operation window, comprising the steps of:
    performing a multi-dimensional electrochemical impedance spectrum (MD-EIS) method to obtain a three-dimensional Nyquist-vs-SoC relation diagram;
    analyzing the three-dimensional Nyquist-vs-SoC relation diagram by using an equivalent circuit model (ECM), to obtain at least one ageing factor;
    defining a stress index relation of a battery operation window, and defining, based on the stress index relation, a plurality of control reference points for the battery operation window; and
    performing a battery discharging control based on the plurality of control reference points;
    wherein the at least one ageing factor further includes a stress factor coefficient;
    wherein the stress factor coefficient includes an impedance coefficient and a Warburg coefficient;
    wherein the stress index relation is defined as impedance coefficient×(x)+Warburg coefficient×(1−x), where x is a value between 0 and 1.

2. The battery control method as claimed in claim 1, wherein the three-dimensional Nyquist-vs-SoC relation diagram further includes a plurality of curves, each of the plurality of curves represents a plurality of battery characteristics at a specific discharge capacity, and a set of the plurality of curves represents the plurality of battery characteristics from a full charged state to a lowest capacity state.

3. The battery control method as claimed in claim 1, wherein a transformation process of the equivalent circuit model comprises the steps of:
    in the three-dimensional Nyquist-vs-SoC relation diagram, distinguishing a total impedance and separating from an inductance effect caused by metal elements of a battery at high frequency region, wherein the total impedance is the sum of a serial impedance in the battery, an impedance of a solid electrolyte interface (SEI) film impedance formed on a surface of an electrode of the battery and a charge transfer impedance;
    separating the serial impedance from the total impedance;
    determining the stress factor coefficient by using the charge transfer impedance and the SEI film impedance; and
    resolving and determining a Warburg coefficient.

4. The battery control method as claimed in claim 1, wherein the impedance coefficient includes a charge transfer impedance and a SEI film impedance.

5. The battery control method as claimed in claim 1, wherein the plurality of control reference points further include a control start point, a stop point of battery discharging, and a stop point of battery charging.

6. The battery control method as claimed in claim 5, wherein the control start point is defined as a point with a stress index value 5%-50% higher than the value at 50% SoC to start controlling the battery.

7. The battery control method as claimed in claim 5, wherein a selection of the control point for an aged battery follows an S4/S2=S3/S1 rule, wherein S1 and S2 are the lower stress indices for a fresh and the aged battery in a 50% SoC region respectively, and S3 and S4 are the control start points for the fresh and the aged batteries respectively.

8. The battery control method as claimed in claim 5, wherein a selection of the stop point of battery charging for an aged battery follows an S8/S2=S7/S1 rule, wherein 51 and S2 are the lower stress indices for a fresh and the aged battery in a 50% SoC region respectively, and S7 and S8 are the stop points of battery charging for the fresh and the aged batteries respectively.

9. The battery control method as claimed in claim 5, wherein a selection of the stop point of battery discharging for an aged battery is as follows:
    S5 and S6 represent the stop points of battery discharging for a fresh and the aged batteries respectively, and the selection of S6 results in that S6 has the same stress index as S5.

* * * * *